United States Patent
Kim et al.

(10) Patent No.: US 6,326,259 B1
(45) Date of Patent: Dec. 4, 2001

(54) METHOD OF MANUFACTURING A CAPACITOR IN A SEMICONDUCTOR DEVICE

(75) Inventors: Kyong Min Kim, Anyang-Shi; Han Sang Song, Seoul; Dong Jun Kim, Ichon-Shi, all of (KR)

(73) Assignee: Hyundai Electronics Industries, Co., Ltd., Kyungki-Do (KR)

( * ) Notice: Subject to any disclaimer, the term of this patent is extended or adjusted under 35 U.S.C. 154(b) by 0 days.

(21) Appl. No.: 09/852,602

(22) Filed: May 10, 2001

(30) Foreign Application Priority Data

Jun. 28, 2000 (KR) .................................................. 00-36053

(51) Int. Cl.[7] ............................................. H01L 21/8242
(52) U.S. Cl. .................. 438/240; 438/3; 438/253

(58) Field of Search ............................... 438/3, 238–241, 438/253–256, 381, 396–399

(56) References Cited

U.S. PATENT DOCUMENTS 6,051,858 * 4/2000 Uchida et al. .......................... 257/295
6,114,200 * 9/2000 Yew et al. ............................... 438/253

* cited by examiner

Primary Examiner—Jey Tsai
(74) Attorney, Agent, or Firm—Marshall, Gerstein & Borun

(57) ABSTRACT

A method of manufacturing a capacitor in a semiconductor device uses a metal as an upper electrode and a lower electrode, and forms a dielectric film in a double structure of a titanium-containing tantalum oxide film and an amorphous tantalum oxide film. Therefore, the invention can secure a sufficient capacitance while improving an electrical characteristic of the capacitor.

11 Claims, 1 Drawing Sheet

METHOD OF MANUFACTURING A CAPACITOR IN A SEMICONDUCTOR DEVICE

BACKGROUND OF THE INVENTION

1. Field of the Invention

The invention relates generally to a method of manufacturing a capacitor in a semiconductor device. More particularly, the invention relates to a method of manufacturing a capacitor in a semiconductor device, wherein a metal is used as an upper electrode and a lower electrode, and a dielectric film is formed in a double structure of a titanium-containing tantalum oxide film and an amorphous tantalum oxide film, thus securing a sufficient capacitance while improving an electrical characteristic of the application.

2. Description of the Prior Art

As a semiconductor device is more highly integrated, the cell size of a capacitor is increasingly reduced, although the capacitance per cell necessary for a stable operation of a device is not changed. A capacitor using a tantalum oxide ($Ta_2O_5$) film, which has been developed as a dielectric film, and a polysilicon film as a lower electrode could not secure a sufficient capacitance.

In order to solve this problem, the lower electrode must be formed of a metal layer to lower the effective thickness or to secure its capacitance, or a material having a high dielectric constant than a tantalum oxide film ($\in$=25) must be used.

SUMMARY OF THE INVENTION

A method of manufacturing a capacitor in a semiconductor device includes the steps of forming a plug and a diffusion prevention film on a semiconductor substrate in which a predetermined structure is formed; depositing a Ru film on the entire structure; patterning the Ru film to form a lower electrode; forming a titanium-containing tantalum oxide film on the entire structure; thereafter performing an annealing process; forming an amorphous tantalum oxide film on the titanium-containing tantalum oxide film; and depositing a metal layer on the entire structure to form an upper electrode.

BRIEF DESCRIPTION OF THE DRAWINGS

The disclosure will be explained in the following description, taken in conjunction with the accompanying drawing, wherein.

DETAILED DESCRIPTION OF PREFERRED EMBODIMENTS

It is an objective of the disclosed method to provide a method of manufacturing a capacitor in a semiconductor device capable of securing a sufficient capacitance, while lowering the effective thickness.

Another objective of the disclosed method is to provide a method of manufacturing a capacitor in a semiconductor device capable of improving a leakage current characteristic.

In the disclosed method, a metal is used as an upper electrode and a lower electrode, and a tantalum oxide film in which titanium is added and an amorphous tantalum oxide film are used as a dielectric film. The tantalum oxide film in which titanium is added can secure a sufficient capacitance, and the amorphous tantalum oxide film can improve an electrical characteristic of the capacitor.

The amorphous tantalum oxide film has a better leakage current characteristic than the crystallized tantalum oxide film, but it increases the effective thickness. On the other hand, the crystallized tantalum oxide film has a better leakage current characteristic than the amorphous tantalum oxide film, but it reduces the effective thickness.

The disclosed method will now be described in detail by way of a preferred embodiment with reference to accompanying drawing.

Figure 1A:
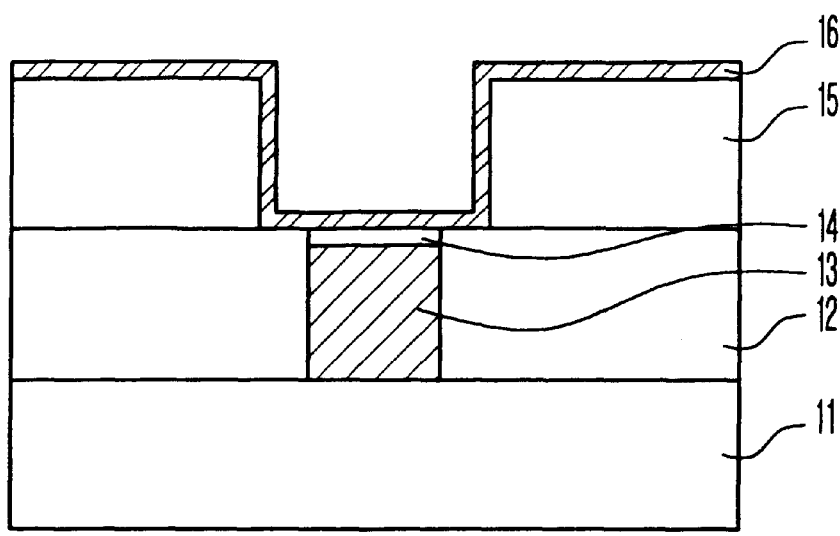
FIG. 1A and 1B are cross-sectional views of a device for explaining a method of manufacturing a capacitor in a semiconductor device according to the present disclosure.

In FIG. 1A, an interlayer insulating film 12 is formed on a semiconductor substrate 11 in which a predetermined structure is formed. Then, a selected portion of the interlayer insulating film 12 is etched to form a contact hole through which the given region of the semiconductor substrate 11 is exposed. Next, a polysilicon film is formed on the entire structure so that the contact hole can be filled. Thereafter, the polysilicon film is blanket-over-etched to form a plug 13 in which an upper portion of the contact hole remains to a predetermined depth. Then a Ti/TiN film, as a diffusion prevention film 14, is formed on the plug 13 within the contact hole. After an oxide film 15 is formed on the entire structure, the diffusion prevention film 14 etches a given region of the oxide film 15 to expose the diffusion prevention film 14. Next, a Ru film 16 as a lower electrode is formed on the entire structure. The Ru film 16 is deposited by introducing gaseous tris (2,4-octanedionato) ruthenium into a reaction furnace containing a wafer, within which a pressure of about 0.1 Torr to about 10 Torr is maintained. At this time, an oxygen and $NH_3$ reaction gas is introduced at a flow rate of about 5 sccm to about 1000 sccm and the wafer within the reaction furnace is heated to about 200° C. to about 350° C. The Ru film 16 is formed in a thickness of about 100 Å to about 500 Å.

Figure 1B:
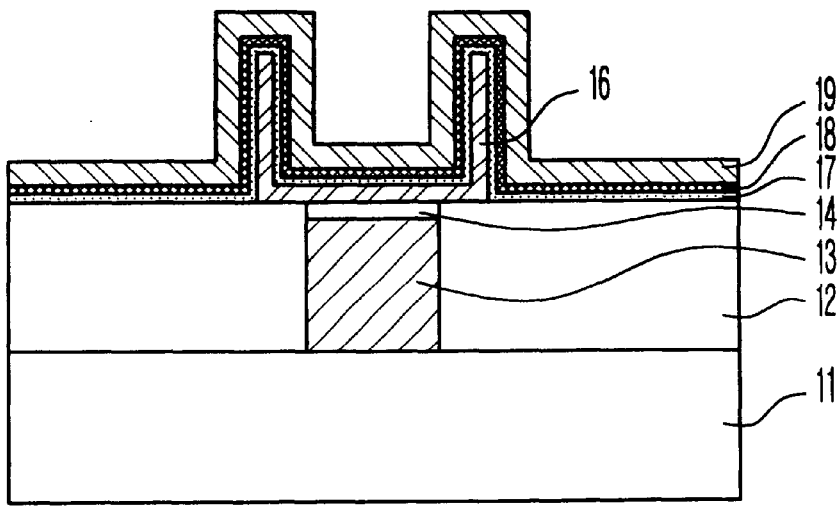

Referring to FIG. 1(b), after the Ru film 16 is polished, the oxide film 15 is removed. Then, a tantalum oxide film 17 in which Ti is added is formed on the entire structure. After a subsequent annealing process is performed, a tantalum oxide film 18 is formed. The tantalum oxide film 18 is amorphous and is not exposed to an annealing process. Then, a TiN film or a Ru film is formed on the entire structure to form an upper electrode. The titanium-containing tantalum oxide film 17 is formed by vaporizing tantalum ethylate (Ta $(OC_2H_5)_5$) in a vaporizer within which the temperature of tantalum ethylate is maintained at about 170° C. to about 190° C., oxygen at a flow rate of about 10 sccm to about 1000 sccm as a reaction gas is introduced into the vaporizer, and the tantalum ethylate is introduce into a reaction furnace within which Ti flows at a rate of about 1 sccm to about 200 sccm. At this time, the reaction furnace is kept at the pressure of about 0.1 Torr to about 1.2 Torr and the wafer within the reaction furnace is heated at about 300° C. to about 400° C.

A subsequent annealing process is performed by two steps: a first step of performing a $N_2O$ plasma or $UV/O_3$ process at a temperature of about 300° C. to about 500° C. and a second step of performing a rapid annealing process or a reaction furnace annealing process using $N_2$ gas and $O_2$ gas at a temperature of about 500° C. to about 700° C. The tantalum oxide film 18 is formed in a manner that tantalum ethylate is made in a gas state in a vaporizer within which the temperature of tantalum ethylate is kept at about 170° C. to about 190° C., oxygen at a flow rate of about 10 sccm to about 1000 sccm as a reaction gas is introduced into the vaporizer, the wafer is heated at a temperature of about 300°

C. to about 400° C., and tantalum ethylate is then introduced into the reaction furnace within which Ti is maintained at a pressure of about 1 Torr to about 1.2 Torr.

As mentioned above, the disclosed method manufactures a capacitor in which a metal is used as an upper electrode and a lower electrode, and a dielectric film is formed in a double structure of a titanium-containing tantalum oxide film and an amorphous tantalum oxide film. Therefore, the method can secure a sufficient capacitance while improving an electrical characteristic of the capacitor.

The disclosed method has been described with reference to a particular embodiment in connection with a particular application. Those having ordinary skill in the art and access to the teachings of the disclosure will recognize additional modifications and applications within the scope thereof.

It is therefore intended by the appended claims to cover any and all such applications, modifications, and embodiments within the scope of the invention.

What is claimed is:

1. A method of manufacturing a capacitor in a semiconductor device, comprising the steps of:

providing a semiconductor substrate in which a predetermined structure is formed;

forming a plug and a diffusion prevention film on said substrate to form an entire structure;

depositing a Ru film on the entire structure;

thereafter patterning said Ru film to form a lower electrode;

forming a titanium-containing tantalum oxide film on the entire structure;

thereafter performing an annealing process;

forming an amorphous tantalum oxide film on said titanium-containing tantalum oxide film; and depositing a metal layer on the entire structure to form an upper electrode.

2. The method of claim 1, wherein said Ru film has a thickness of about 100 Å to about 500 Å, and is formed by introducing gaseous tris (2,4-octanedionato) ruthenium into a reaction furnace within which a pressure of about 0.1 Torr to about 10 Torr is maintained, said furnace containing a wafer, and heating the wafer to about 200° C. to about 350° C.

3. The method of claim 2, comprising the steps of introducing oxygen or $NH_3$ to the furnace at a rate of about 5 sccm to about 1000 sccm as the reaction gas for forming said Ru film.

4. The method of claim 1, wherein said titanium-containing tantalum oxide film is formed by providing gaseous tantalum ethylate and introducing oxygen or titanium at a rate of about 1 sccm to about 200 sccm, to a reaction furnace containing a wafer, and heating the wafer to a temperature of about 300° C. to about 400° C.

5. The method of claim 4, comprising the step of maintaining said reaction furnace at a pressure of about 0.1 Torr to about 1.2 Torr.

6. The method of claim 4, comprising the step of introducing oxygen at a flow rate of about 10 sccm to about 1000 sccm.

7. The method of claim 4, comprising the step of introducing titanium at a flow rate of about 1 sccm to about 200 sccm.

8. The method of claim 1, wherein said annealing process comprises a step of performing a $N_2O$ plasma or $UV/O_3$ process at a temperature of about 300° C. to about 500° C., and a step of performing a rapid annealing process or a reaction furnace annealing process using $N_2$ gas and $O_2$ gas at a temperature of about 500° C. to about 700° C.

9. The method of claim 1, comprising the step of forming said amorphous tantalum oxide film by introducing gaseous tantalum ethylate ($Ta(OC_2H_5)_5$) and oxygen at a flow rate of about 10 sccm to about 1000 sccm to a reaction furnace containing a wafer, and heating the wafer to a temperature of about 300° C. to about 400° C.

10. The method of claim 9, comprising the step of maintaining said reaction furnace at a pressure of about 0.1 Torr to about 1.2 Torr.

11. The method of claim 1, wherein said upper electrode comprises a Ru film or a TiN film.

* * * * *